United States Patent
Clark

(10) Patent No.: US 10,261,105 B2
(45) Date of Patent: Apr. 16, 2019

(54) ANCHOR TRACKING FOR MEMS ACCELEROMETERS

(71) Applicant: Analog Devices, Inc., Norwood, MA (US)

(72) Inventor: William A. Clark, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/890,835

(22) Filed: Feb. 7, 2018

(65) Prior Publication Data

US 2018/0231580 A1 Aug. 16, 2018

Related U.S. Application Data

(60) Provisional application No. 62/457,768, filed on Feb. 10, 2017.

(51) Int. Cl.
*G01P 15/125* (2006.01)
*G01P 15/18* (2013.01)
*G01P 15/08* (2006.01)

(52) U.S. Cl.
CPC ............ *G01P 15/125* (2013.01); *G01P 15/18* (2013.01); *B81B 2201/0235* (2013.01);
(Continued)

(58) Field of Classification Search
CPC .... G01P 15/125; G01P 15/0802; G01P 15/18; G01P 2015/084; G01P 21/00;
(Continued)

(56) References Cited

U.S. PATENT DOCUMENTS 5,646,347 A 7/1997 Weiblen et al.
5,719,336 A 2/1998 Ando et al.
(Continued)

FOREIGN PATENT DOCUMENTS

CN 102375075 A 3/2012
CN 103852598 A 6/2014
(Continued)

OTHER PUBLICATIONS

International Search Report and Written Opinion dated Dec. 10, 2014 for Application No. PCT/US2014/057582.
(Continued)

*Primary Examiner* — Harshad R Patel
*Assistant Examiner* — Nigel H Plumb
(74) *Attorney, Agent, or Firm* — Wolf, Greenfield & Sacks, P.C.

(57) ABSTRACT

A microelectromechanical system (MEMS) accelerometer is described. The MEMS accelerometer is arranged to limit distortions in the detection signal caused by displacement of the anchor(s) connecting the MEMS accelerometer to the underlying substrate. The MEMS accelerometer may include masses arranged to move in opposite directions in response to an acceleration of the MEMS accelerometer, and to move in the same direction in response to displacement of the anchor(s). The masses may, for example, be hingedly coupled to a beam in a teeter-totter configuration. Motion of the masses in response to acceleration and anchor displacement may be detected using capacitive sensors.

20 Claims, 7 Drawing Sheets

(52) U.S. Cl.
    CPC ... *B81B 2203/0307* (2013.01); *B81B 2203/04* (2013.01); *G01P 2015/084* (2013.01)

(58) Field of Classification Search
    CPC ...... G01P 21/02; G01P 15/0888; G01P 15/00; G01P 1/00; G01P 9/04; G01C 19/5719; G01C 19/56; B81B 2201/0235; B81B 2203/0307; B81B 2203/04; A63B 2220/40
    See application file for complete search history.

(56) References Cited

U.S. PATENT DOCUMENTS

| | | | |
|---|---|---|---|
| 5,939,633 A | 8/1999 | Judy | |
| 6,230,563 B1 | 5/2001 | Clark et al. | |
| 6,841,992 B2 | 1/2005 | Yue et al. | |
| 6,892,576 B2 | 5/2005 | Samuels et al. | |
| 6,936,492 B2 | 8/2005 | McNeil et al. | |
| 7,197,928 B2 | 4/2007 | Chen et al. | |
| 7,240,552 B2 | 7/2007 | Acar et al. | |
| 7,444,869 B2* | 11/2008 | Johnson | G01C 19/5719 73/504.12 |
| 7,520,171 B2 | 4/2009 | Merassi et al. | |
| 7,610,809 B2 | 11/2009 | McNeil et al. | |
| 8,056,415 B2 | 11/2011 | McNeil et al. | |
| 8,146,425 B2 | 4/2012 | Zhang et al. | |
| 8,215,177 B2 | 7/2012 | Hayner et al. | |
| 8,321,170 B2 | 11/2012 | Schultz et al. | |
| 8,443,667 B2* | 5/2013 | Trusov | G01C 19/5719 73/504.12 |
| 8,453,504 B1 | 6/2013 | Mao | |
| 8,555,720 B2 | 10/2013 | Schultz | |
| 8,689,632 B2 | 4/2014 | Jia et al. | |
| 8,839,670 B2* | 9/2014 | Qiu | G01P 15/125 73/514.32 |
| 8,960,002 B2 | 2/2015 | Nasiri et al. | |
| 8,978,475 B2 | 3/2015 | Acar | |
| 9,010,184 B2 | 4/2015 | Zou et al. | |
| 9,097,524 B2 | 8/2015 | Seeger et al. | |
| 9,134,337 B2* | 9/2015 | Simoni | G01P 15/125 |
| 9,176,157 B2 | 11/2015 | Simoni et al. | |
| 9,612,254 B2* | 4/2017 | Naumann | G01P 15/125 |
| 9,927,459 B2 | 3/2018 | Clark et al. | |
| 2004/0231420 A1* | 11/2004 | Xie | B81B 3/0062 73/514.32 |
| 2008/0178671 A1* | 7/2008 | Miller | G01P 15/125 73/488 |
| 2009/0314085 A1 | 12/2009 | Stahl et al. | |
| 2010/0107763 A1 | 5/2010 | Lin et al. | |
| 2011/0023604 A1 | 2/2011 | Cazzaniga et al. | |
| 2011/0030473 A1 | 2/2011 | Acar | |
| 2012/0125104 A1 | 5/2012 | Qiu et al. | |
| 2013/0068018 A1* | 3/2013 | Seeger | G01C 19/5712 73/504.12 |
| 2013/0104651 A1 | 5/2013 | Li et al. | |
| 2013/0180332 A1 | 7/2013 | Jia et al. | |
| 2013/0186171 A1* | 7/2013 | Merrill, Jr. | G01P 15/125 73/1.38 |
| 2013/0214367 A1 | 8/2013 | van der Heide | |
| 2013/0333471 A1 | 12/2013 | Chien | |
| 2014/0298909 A1* | 10/2014 | Simoni | B81B 7/0048 73/514.32 |
| 2014/0360268 A1 | 12/2014 | Qiu et al. | |
| 2015/0122024 A1 | 5/2015 | Clark et al. | |
| 2015/0192603 A1 | 7/2015 | Baldasarre et al. | |
| 2015/0268268 A1 | 9/2015 | Liu et al. | |
| 2015/0293141 A1* | 10/2015 | Wu | G01P 15/125 73/504.12 |
| 2016/0097791 A1* | 4/2016 | Zhang | B81B 3/0054 73/514.32 |
| 2016/0377648 A1* | 12/2016 | Zhang | G01P 15/125 73/514.32 |
| 2018/0038887 A1 | 2/2018 | Zhang et al. | |

FOREIGN PATENT DOCUMENTS

| | | |
|---|---|---|
| DE | 102013111787 A1 | 6/2014 |
| EP | 1 640 726 A1 | 3/2006 |
| JP | 4787746 B2 | 10/2011 |
| JP | 5627590 B2 | 11/2014 |
| JP | 5638598 B2 | 12/2014 |
| JP | 5714648 B2 | 5/2015 |
| JP | 6144704 B2 | 6/2017 |
| WO | WO 2012/122879 A1 | 9/2012 |

OTHER PUBLICATIONS

International Search Report and Written Opinion dated Jan. 26, 2016 in connection with International Application No. PCT/US2015/052597.

International Search Report and Written Opinion dated Nov. 8, 2017 in connection with International Application No. PCT/US2017/044581.

* cited by examiner

ANCHOR TRACKING FOR MEMS ACCELEROMETERS

CROSS-REFERENCE TO RELATED APPLICATION

This application claims priority under 35 U.S.C. § 119(e) to U.S. Provisional Patent Application Ser. No. 62/457,768, entitled "ANCHOR TRACKING FOR MEMS ACCELEROMETERS," filed on Feb. 10, 2017, which is hereby incorporated herein by reference in its entirety.

FIELD OF THE DISCLOSURE

The present application relates to microelectromechanical systems (MEMS) inertial sensors.

BACKGROUND

Some microelectromechanical systems (MEMS) capacitive sensors sense in-plane accelerations. Some such sensors comprise a fixed electrode and a movable electrode. The fixed electrode is anchored to a substrate while the movable electrode is connected to a proof mass. The proof mass moves in response to accelerations in the plane of the proof mass.

SUMMARY OF THE DISCLOSURE

Some aspects of the present disclosure are directed to a MEMS accelerometer. The MEMS accelerometer may be arranged to limit distortions in the detection signal caused by displacement of the anchor(s) connecting the MEMS accelerometer to the underlying substrate. The MEMS accelerometer may include masses arranged to move in opposite directions in response to an acceleration of the MEMS accelerometer, and to move in the same direction in response to displacement of the anchor(s). The masses may, for example, be hingedly coupled to a beam in a teeter-totter configuration. Motion of the masses in response to acceleration and anchor displacement may be detected using capacitive sensors.

Some embodiments are directed to MEMS accelerometer comprising at least one anchor coupled to a substrate, a proof mass connected to the at least one anchor, and a counter-balance mass connected to the proof mass and to the at least one anchor, wherein, in response to an acceleration of the MEMS accelerometer in a first direction, the proof mass is configured to move in the first direction and the counter-balance mass is configured to move in a second direction opposite from the first direction.

Some embodiments are directed to a MEMS accelerometer comprising at least one anchor coupled to a substrate, a beam coupled to the at least one anchor, a proof mass coupled to the beam and a counter-balance mass coupled to the beam, and a first electrode and a second electrode, the first and second electrodes being coupled to the substrate, wherein the proof mass forms a first capacitive sensor with the first fixed electrode and the counter-balance mass forms a second capacitive sensor with the second fixed electrode.

Some embodiments are directed to a method for detecting acceleration using a MEMS accelerometer, the method may comprise sensing motion of a proof mass in a first direction in response to acceleration of the MEMS accelerometer to obtain a first detection signal, the proof mass being coupled to at least one anchor, sensing motion of a counter-balance mass in a direction that is opposite from the first direction in response to the acceleration of the MEMS accelerometer to obtain a second detection signal, the counter-balance mass being coupled to the at least one anchor, sensing motion of the proof mass in a second direction in response to displacement of the at least one anchor to obtain a third detection signal, sensing motion of the counter-balance mass in the second direction in response to the displacement of the at least one anchor to obtain a fourth detection signal, and detecting the acceleration of the MEMS accelerometer using the first, second, third and fourth detection signals.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
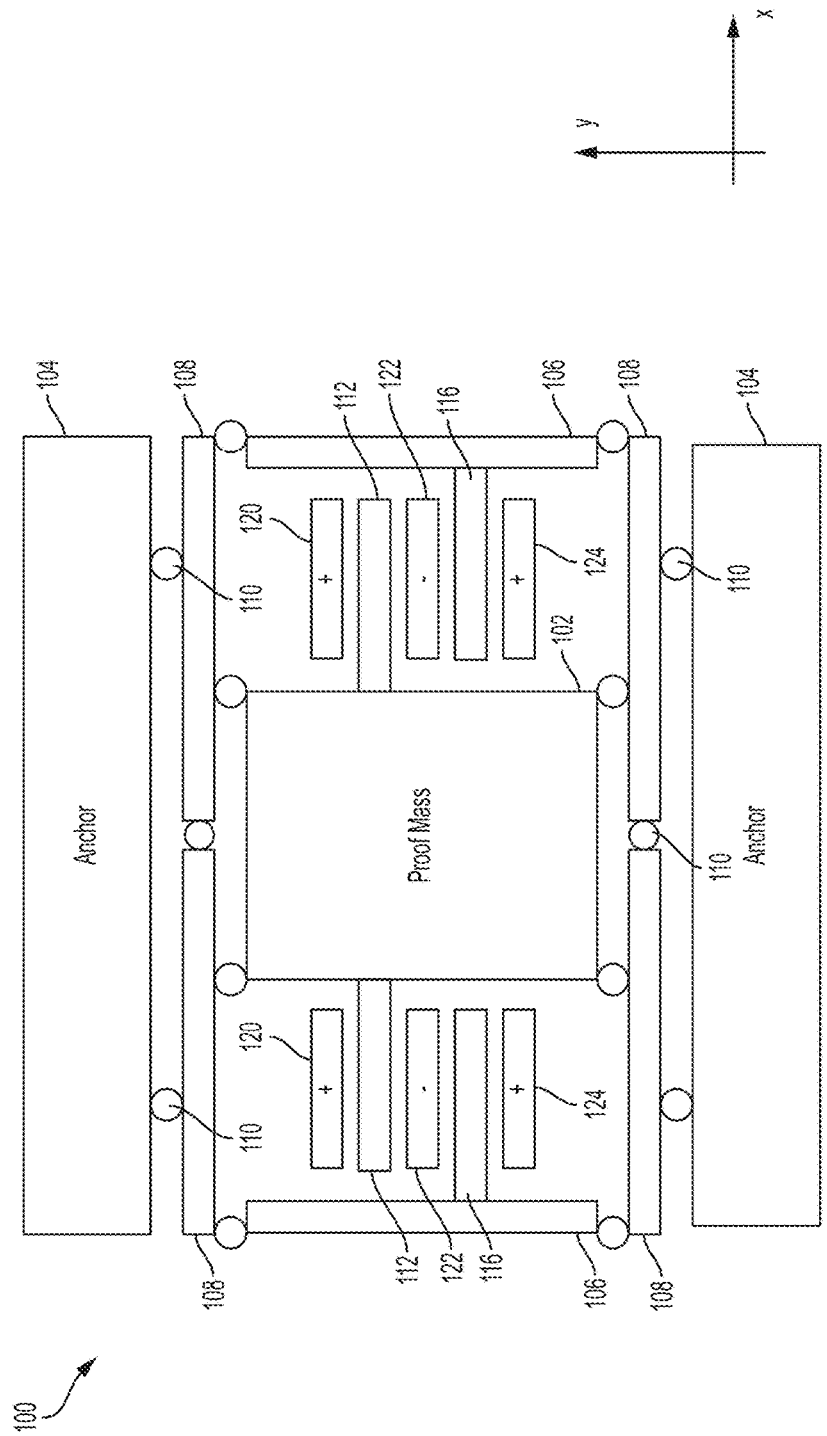
FIG. 1A is a schematic diagram illustrating a MEMS accelerometer, in accordance with some embodiments of the technology described herein.

Displacement of the anchor(s) of a microelectromechanical systems (MEMS) device, including anchor(s) coupling a proof mass and/or electrodes to a substrate of the device, can negatively impact performance of the MEMS device because such displacement can generate a non-zero sensed signal which is due to anchor displacement rather than acceleration of the proof mass. The inventor has appreciated that accuracy of a MEMS inertial sensor, such as an accelerometer, configured to sense in-plane accelerations may be improved by detecting such displacement of the anchors. Detection of anchor displacement may be accomplished through one or more sensing elements, an example of which is a capacitive sensor.

Displacement of the anchor(s) to which the proof mass is connected can be caused, in some circumstances, by stress. One example of stress includes packaging stress, which may be caused by temperature variations. Having different thermal expansion coefficients, the substrate and the package may expand by different amounts in response to thermal variations, and as a consequence mechanical stress may arise. In some circumstances, mechanical stress may lead to warping of the substrate, thus causing the anchors to be displaced from their intended positions. Displacement of the anchor(s) may negatively impact the ability of a MEMS inertial sensor to accurately detect acceleration. For example, in some circumstances, displacement of the anchor(s) may be detected by the MEMS inertial sensor, thus giving rise to a detection signal. As a result, it may be difficult to discern whether a detection signal has been generated in response to acceleration or to anchor displacement.

Conventional techniques for detecting anchor displacement utilize dedicated sense capacitors whose purpose is to detect anchor displacement—acceleration is sensed with other capacitors. In these conventional configurations, the effects of anchor displacement can be mitigated via signal post-processing, such as by subtracting signals generated in response to anchor displacement from the signals generated in response to acceleration of the proof mass.

The inventor has appreciated that the use of dedicated sense capacitors for detecting anchor displacement may negatively impact the sensitivity of a MEMS inertial sensor and the linearity of its response to changes in acceleration. The inventor has developed techniques for limiting the effects of anchor displacement without using dedicated sense capacitors for directly measuring the amount of sensor displacement.

Some embodiments described herein address all of the above-described issues that the inventors have recognized with conventional anchor tracking techniques. However, not every embodiment described herein addresses every one of these issues, and some embodiments may not address any of them. As such, it should be appreciated that embodiments of the technology described herein are not limited to addressing all or any of the above-discussed issues of conventional techniques for anchor tracking.

In some embodiments, a MEMS inertial sensor includes sense capacitors configured to sense both anchor displacement and acceleration of the proof mass. Unlike conventional MEMS inertial sensors, in which acceleration and anchor displacement are sensed using separate sense capacitors, the signals generated by the sense capacitors reflect both accelerations of the MEMS inertial sensor and anchor displacement.

As compared to conventional MEMS inertial sensors, the benefits of the MEMS inertial sensors described herein include: 1) the anchor tracking capability may remove stress related offset; 2) sense capacitor density may increase to one sensing surface per finger from two sensing surfaces every three fingers; 3) linearity may be increased due to acceleration-dependent anchor tracking capacitors, and/or 4) because the sense capacitor surfaces are major contributors to damping, in some embodiments, damping per unit area may increase. The benefits identified above may be advantageous for automotive accelerometers. However, MEMS inertial sensors of the type described herein are not limited to use in connection with automotive applications, and may be used in any other suitable context.

FIG. 1A illustrates schematically a MEMS accelerometer, according to some embodiments of the technology described herein. As shown in FIG. 1A, MEMS accelerometer 100 comprises proof mass 102, anchors 104, counter-balance masses 106, beams 108, fingers 112 coupled to proof mass 102, and fingers 116 coupled to counter-balance masses 106. Each of fingers 112 and 116 may have one end connected to a mass (i.e., a proof mass or a counter-balance mass) and one free end. Fingers 112 and 116, proof mass 102 and counter-balance masses 106 may be made of an electrically conductive material. While one proof mass and two counter-balance masses are shown in the illustrative embodiment of FIG. 1A, it should be appreciated that any suitable number of proof masses and counter-balance masses may be used in other embodiments.

Figure 1B:
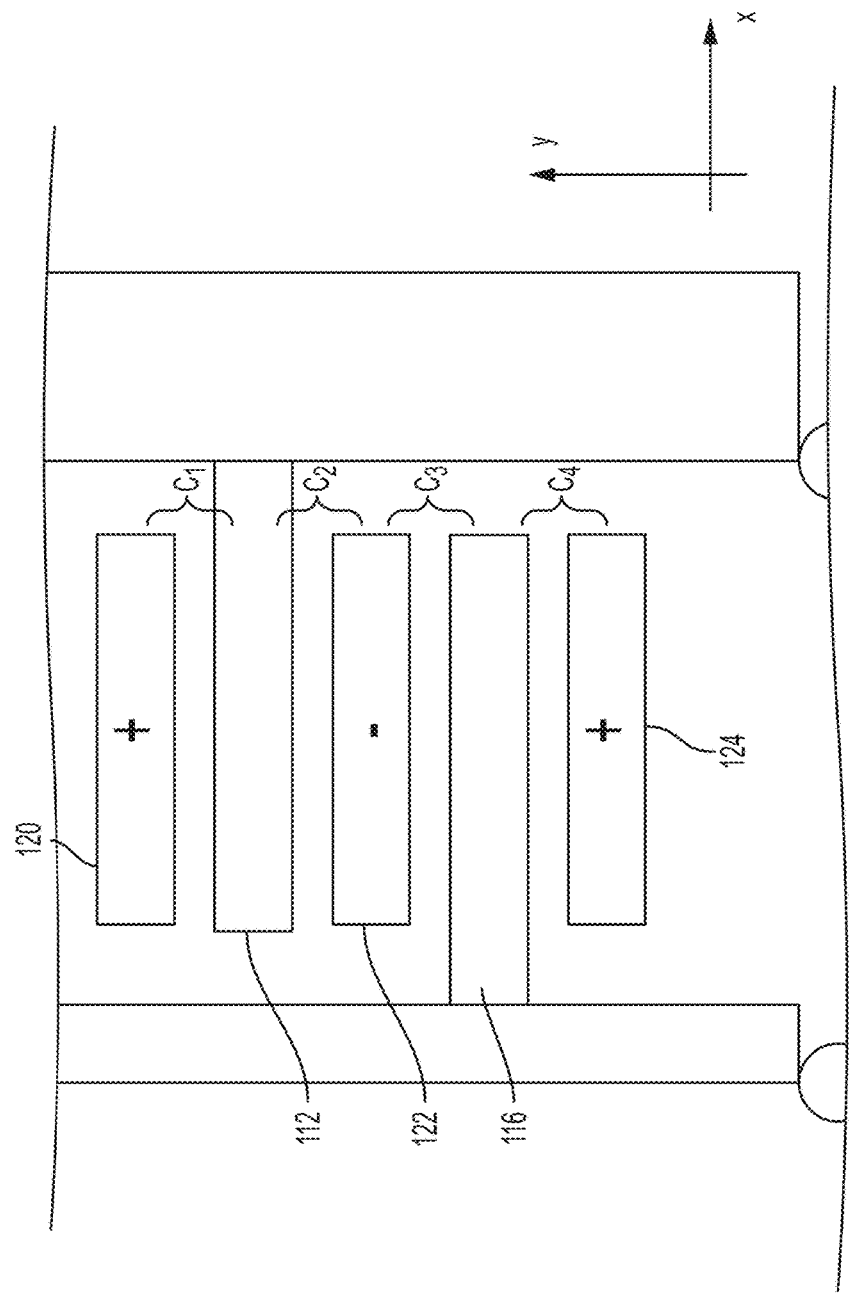
FIG. 1B is a schematic diagram illustrating a portion of the MEMS accelerometer of FIG. 1A in additional detail, in accordance with some embodiments of the technology described herein.
Figure 1D:
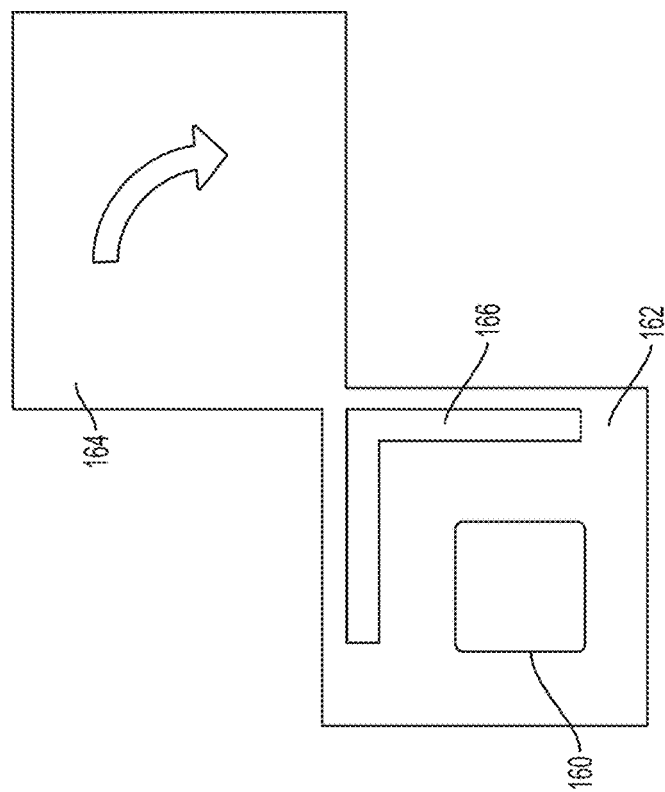
FIG. 1D is a schematic diagram illustrating another example of a hinge, in accordance with some embodiments of the technology described herein.
Figure 1C:
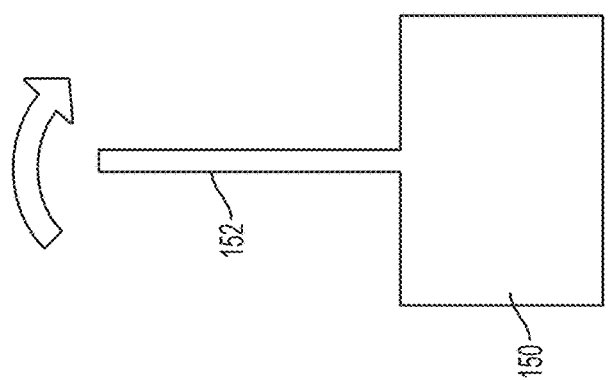
FIG. 1C is a schematic diagram illustrating an example of a hinge, in accordance with some embodiments of the technology described herein.

Also, as shown in FIG. 1A, MEMS accelerometer 100 comprises fixed electrodes 120, 122, and 124. In some embodiments, fixed electrodes 120, 122, and 124 are anchored to the substrate. As a result, fixed electrodes 120, 122, and 124 may experience displacement in response to stress in the substrate. Proof mass 102 is coupled to anchors 104 through beams 108 and hinges 110. Counter-balance masses 106 are also coupled to anchors 104 through beams 108 and hinges 110. In some embodiments, hinges 110 may include an elastic member (e.g., a spring) configured to deform in response to accelerations and/or anchor displacement. In some embodiments, an anchor 104 is hingedly coupled to a beam 108. Illustrative examples of hinges are illustrated in FIGS. 1C-1D. The hinge illustrated in the example of FIG. 1C includes an elongated beam 152 projecting from a fixed portion 150. Elongated beam 152 may laterally pivot while rejecting compression and lengthening along its axis. The distal end of elongated beam 152 may be connected to a rigid member. The hinge illustrated in FIG. 1D includes a fixed portion 162 connected to anchor 160, and a movable portion 164. Movable portion 164 is connected to fixed portion 162 through a pair of beams. The beams are formed by removing a region 166 of fixed portion 162. As illustrated, deformation of the beams may allow for pivoting of the movable portion 164. The hinges illustrated in FIGS. 1C-1D allow one rigid member to rotate with respect to another while rejecting translational motion.

Referring back to FIG. 1A, anchors 104 may be connected to an underlying substrate (e.g., a silicon substrate) while proof mass 102 and counter-balance masses 106 may be suspended above the substrate. Beam 108 may connect the anchors to the proof mass. In some embodiments, MEMS accelerometer 100 may be arranged to sense accelerations in a direction parallel to either to the y-axis (e.g., as shown in FIG. 1A) or to the x-axis. However, it should be appreciated that, in some embodiments, a MEMS accelerometer may be used to sense accelerations in any suitable direction or directions. Furthermore, in some embodiments, a MEMS accelerometer may be configured to detect acceleration in two or three directions, as aspects of the technology described herein are not limited in this respect.

In some embodiments, when MEMS accelerometer 100 is subjected to an acceleration in a direction parallel to the y-axis (for example, in the direction toward the bottom of FIG. 1A), proof mass 102 may move in the same direction while counter-balance masses 106 may move in the opposite direction (toward the top of FIG. 1A). Motion of the counter-balance masses in the opposite direction may be caused by beams 108. Accordingly, when proof mass 102 moves toward the bottom of FIG. 1A, the beams may pivot around hinges 110, thus transferring the motion of the proof mass to the counter-balance masses. In this respect, MEMS accelerometer 100 may be considered to operate in a manner analogous to that of a teeter-totter or seesaw. When a mass on one end of a seesaw moves in one direction (e.g., up), another mass on the other end of the seesaw moves in another direction (e.g., down) as a beam pivots around a hinge. Similarly, in the illustrative MEMS accelerometer of FIG. 1A, as the proof mass 102 moves in one direction, the counter-balance masses 106 move in the other direction, as a result of being coupled to proof mass 102 through beams 108 and hinges 110.

In some embodiments, fingers 112 and 116 form sense capacitors with the fixed electrodes 120, 122, and 124. For example, as shown in more detail in FIG. 1B, finger 112 forms a first sense capacitor $C_1$ with fixed electrode 120 and a second sense capacitor $C_2$ with fixed electrode 122. Since each of fingers 112 has one end connected to proof mass 102, fingers 112 may move with proof mass 102. As also shown in the example of FIG. 1B, finger 116 forms a first sense capacitor $C_3$ with fixed electrode 122 and a second sense capacitor $C_4$ with fixed electrode 124. Fingers 116 may move with counter-balance masses 106. Fixed electrodes 120, 122 and 124 may be connected to the substrate, and as a result, may remain substantially still (e.g., may move by less than 100 nm or less than 10 nm) even when the MEMS accelerometer is subjected to accelerations. Therefore, the separation between the fingers and the fixed electrodes may vary as the proof mass and the counter-balance masses move in response to an acceleration and/or anchor displacement. Variation in this separation may cause a variation in the capacitance of the sense capacitors.

In some embodiments, sense circuitry may be coupled to the capacitors $C_1$, $C_2$, $C_3$ and $C_4$ and may be configured to combine the signals generated by such capacitors in such a way to limit the effect of anchor displacement. For example, the sense circuitry may be configured to provide a detection signal S that is proportional to $\Delta C_1 - \Delta C_2 - \Delta C_3 + \Delta C_4$, where $\Delta C_1$, $\Delta C_2$, $\Delta C_3$ and $\Delta C_4$ represent variations in the capacitances $C_1$, $C_2$, $C_3$ and $C_4$, respectively, caused by acceleration of MEMS accelerometer 100 and/or by anchor displacement. Alternative implementations may be used, in other embodiments, to compute detection signals.

To illustrate how the effect of anchor displacement is mitigated, let us first consider a case in which the anchors are displaced in a direction toward the bottom of FIG. 1B, in the absence of accelerations. It will be assumed, for the sake of clarity, that the capacitances $C_1$, $C_2$, $C_3$ and $C_4$ are equal to one another. However, capacitances $C_1$, $C_2$, $C_3$ and $C_4$ are not limited in this respect and may assume different values in some embodiments. In this circumstance, fingers 112 and 116 move in the direction toward the bottom of FIG. 1B, and $\Delta C_1 = \Delta C_3 = -\Delta C_{anchor}$ and $\Delta C_2 = \Delta C_4 = \Delta C_{anchor}$, where $\Delta C_{anchor}$ is the variation in capacitance caused by anchor displacement. As a result, detection signal S is given by:

$$S = \Delta C_1 - \Delta C_2 - \Delta C_3 + \Delta C_4 = -\Delta C_{anchor} - \Delta C_{anchor} + \Delta C_{anchor} + \Delta C_{anchor} = 0$$

Thus, detection signal S does not reflect displacement of the anchors.

Let us now consider a case in which the anchors are displaced in a direction toward the bottom of FIG. 1B, and MEMS accelerometer 100 undergoes an acceleration in the same direction. In this circumstance, fingers 112 and 116 move in a direction toward the bottom of FIG. 1B in response to anchor displacement. In addition, in response to acceleration of MEMS accelerometer 100, finger 112 moves toward the bottom of FIG. 1B and finger 116 moves in the opposite direction. As a result, $\Delta C_1 = -\Delta C_{anchor} - \Delta C_{accel}$, $\Delta C_2 = \Delta C_{anchor} + \Delta C_{accel}$, $\Delta C_3 = -\Delta C_{anchor} + \Delta C_{accel}$, and $\Delta C_4 = \Delta C_{anchor} - \Delta C_{accel}$, where $\Delta C_{accel}$ is the variation in capacitance caused by acceleration. The resulting detection signal S is equal to:

$$S = \Delta C_1 - \Delta C_2 - \Delta C_3 + \Delta C_4 = -\Delta C_{anchor} - \Delta C_{accel} - \Delta C_{anchor} - \Delta C_{accel} + \Delta C_{anchor} - \Delta C_{accel} + \Delta C_{anchor} - \Delta C_{accel} = -4\Delta C_{accel}$$

Thus, detection signal S depends solely on the acceleration, while the anchor displacement contribution is cancelled out.

The inventor has further appreciated that the use of non-dedicated sense capacitors for sensing anchor displacement may be used in connection with techniques for enhancing the dynamic range of a MEMS inertial sensor without having to sacrifice linearity. In some embodiments, the dynamic range may be enhanced by using sense circuitry coupled to the sense capacitors and configured to attenuate the response of the MEMS inertial sensor by an attenuation coefficient. In this way, the MEMS inertial sensor's sensitivity is reduced, and the dynamic range is increased. For example, the sense circuitry may be configured to provide a detection signal S that is proportional to $(\Delta C_1 - \Delta C_2 - \Delta C_3 + \Delta C_4)/\Sigma C$, where $\Sigma C$ may represent the sum of the capacitances $C_1$, $C_2$, $C_3$ and $C_4$. As a result, the response of the MEMS inertial sensor is attenuated by the factor $1/\Sigma C$, and the dynamic range is extended. The inventor has appreciated that, in some circumstances, the presence of such an attenuation coefficient may introduce non-linearities in the detection signal S'. However, The inventor has further appreciated that the use of non-dedicated sense capacitors in the manner described above may obviate the non-linearities introduced by the attenuation coefficient $1/\Sigma C$, because such an attenuation coefficient may be acceleration-dependent.

In some embodiments, the weight of the proof mass and the counter-balance masses may be adjusted to provide a desired effect. For example, the weight of the masses may be adjusted to provide MEMS accelerometer 100 with a desired resonance frequency. Depending on the application in which a MEMS inertial sensor is utilized, it may be desirable to set the resonant frequency within a certain range, for example to substantially match an expected frequency of oscillation.

In some embodiments, proof mass 102 may be heavier than at least one (e.g., all) of the counter-balance masses. It should be appreciated, however, that the application is not limited in this respect as the proof mass may be lighter than a counter-balance mass, or may have the same weight.

Because MEMS accelerometer 100 may have, in some embodiments, a light mass and a heavy mass, the response of the sensor may be reduced by the ratio of the masses. The sensitivity of the accelerometer can be expressed as:

$$\frac{X}{A}(s) = \frac{G_X}{s^2 + \frac{\omega_0}{Q}s + \omega_0^2} \sim \frac{G_X}{\omega_0^2}$$

where the modal G sensitivity $G_X$ may be defined as $G_X = (M_1 - M_2)/(M_1 + M_2)$, and may be less than 1 in some embodiments.

Traditional accelerometer designs are constrained by the allowable displacement of the proof mass set by the sense capacitor gap.

$$\omega_0 \sim \sqrt{\frac{G_X A_{max}}{X_0}}$$

In the above equation, $X_0$ represents the maximum displacement, $\omega_0$ represents the resonant frequency, $G_X$ represents the modal G sensitivity, and $A_{max}$ represents the maximum acceleration that MEMS accelerometer 100 can withstand without experiencing non-linear effects. In a traditional design, in which $G_X = 1$, enduring a large shock (e.g., $10^4$ m/s$^2$ or higher) with a sense gap of 2 μm may lead to a resonant frequency $\omega_0$ of about 10 kHz. However, in some circumstances, the desired application bandwidth may be much lower, for example between 100 Hz and 1 KHz.

Figure 1E:
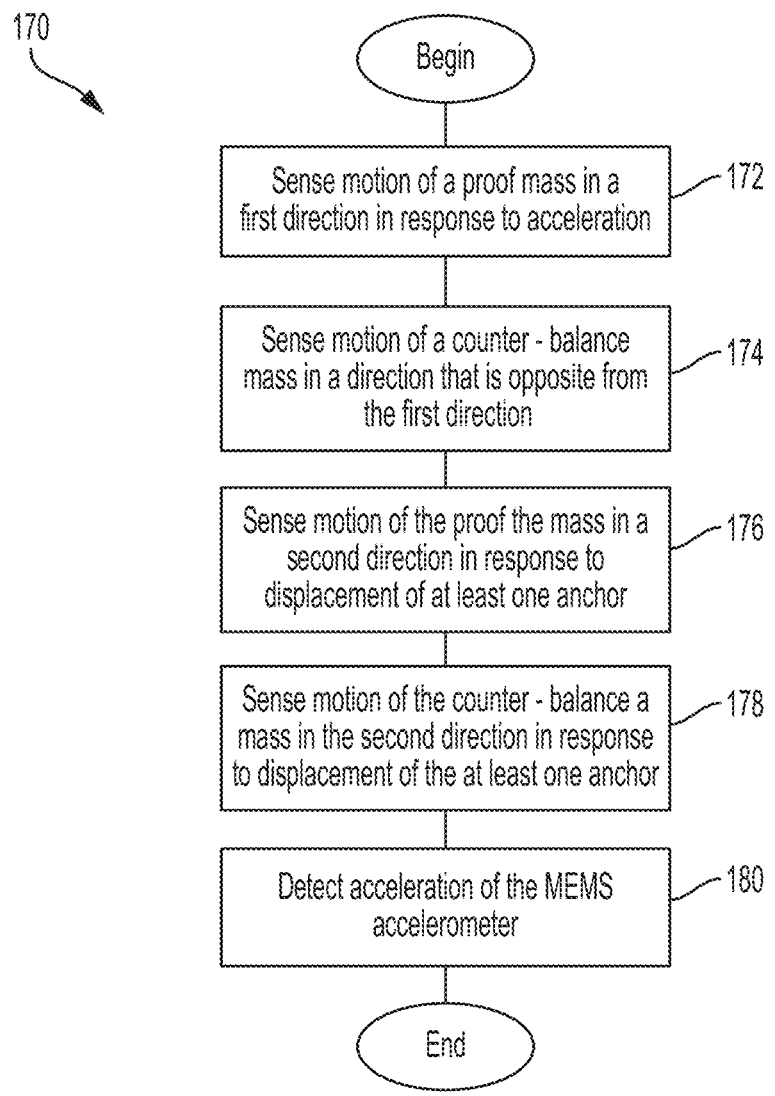
FIG. 1E is a flowchart illustrating a method for detecting acceleration using a MEMS accelerometer, in accordance with some embodiments of the technology described herein.

FIG. 1E is a flowchart illustrating a method for detecting acceleration using a MEMS accelerometer, in accordance with some embodiments of the technology described herein. Method 170 may implemented using any one of the MEMS accelerometers described herein, or using alternative MEMS accelerometers. Method 170 begins at act 172, in which motion of a proof mass (e.g., proof mass 102) in a first direction in response to acceleration of the MEMS accelerometer is sensed to obtain a first detection signal. The first detection signal may be obtained through one or more capacitive sensors.

At act 174, motion of a counter-balance mass (e.g., counter-balance mass 106) in a direction that is opposite from the first direction in response to the acceleration of the MEMS accelerometer is sensed to obtain a second detection signal.

At act 176, motion of the proof mass in a second direction in response to displacement of the at least one anchor is sensed to obtain a third detection signal, where the at least one anchor couples the proof mass to the substrate. The second direction may or may not be parallel to the first direction.

At act 178, motion of the counter-balance mass in the second direction in response to the displacement of the at least one anchor is sensed to obtain a fourth detection signal. It should be appreciated that the acts 172, 174, 176 and 178 may be performed simultaneously, or in any suitable order.

At act 180, acceleration of the MEMS accelerometer is detected using the first, second, third and fourth detection signals.

The ability to adjust $G_x$, may provide an additional design degree of freedom. In some embodiments, by having a $G_x$ that is less than 1, the resonant frequency may be lowered to better match the application bandwidth. Also notice that with fixed damping, the quality factor Q of the mode may decrease, thus providing an improved over-damping behavior.

A further benefit of MEMS accelerometers of the type described herein is that input referred electrostatic self-test may increase by substantially the same factor by which $G_x$ is reduced. However, the input referred noise may increase.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

In some embodiments, MEMS inertial sensors of the type described herein may provide an additional design degree of freedom: the modal G sensitivity $G_x$. In some embodiments, the ability to adjust $G_x$ may help designers to match resonant frequency to application bandwidth. In some embodiments, improved over damping may be accomplished by adjusting Gx. In some embodiments, MEMS inertial sensors of the type described herein may exhibit increased input-referred electrostatic self-test. One disadvantage is that MEMS of the type described herein may exhibit increased input referred noise.

Figure 2:
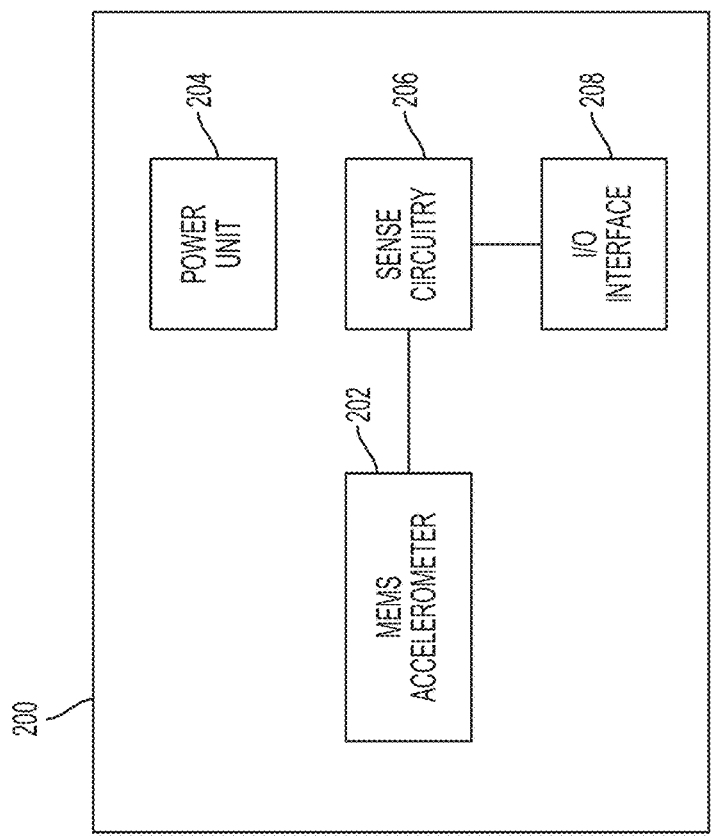
FIG. 2 is a block diagram of a system comprising a MEMS accelerometer and sense circuitry, in accordance with some embodiments of the technology described herein.

In some embodiments, a MEMS inertial sensor, such as an accelerometer, of the types described herein may be connected to circuitry configured to compensate sense signals with compensation signals. FIG. 2 is a block diagram illustrating a system 200 comprising a MEMS accelerometer 202, a power unit 204, sense circuitry 206 and input/output (I/O) interface 208. MEMS accelerometer 202 may serve as MEMS accelerometer 100. In some embodiments, sense circuitry 106 and MEMS accelerometer 102 may be disposed on the same substrate, such as a silicon substrate. In other embodiments, sense circuitry 106 and MEMS accelerometer 102 may be disposed on separate substrates, which may be bonded to one another and/or packaged within a common housing. In some embodiments, MEMS accelerometer 102 may further comprise an accelerometer configured to sense out-of-plane accelerations, e.g., in a direction perpendicular to the xy-plane. Such out-of-plane accelerometers may comprise one or more compensation structures configured to sense displacement of one or more anchors. In some embodiments, MEMS accelerometer 102 may further comprise one or more angular accelerometers configured to sense angular acceleration about one, two or three axes. Sense circuitry 106 may be configured to receive sense signals obtained through one or more sense capacitors and compensation signals obtained through one or more compensation capacitors.

System 200 may periodically transmit, via wired connections or wirelessly, a compensated sense signal to an external monitoring system, such as a computer, a smartphone, a tablet, a smartwatch, smart glasses, or any other suitable receiving device. I/O interface 208 may be configured to transmit and/or receive data via Wi-Fi, Bluetooth, Bluetooth Low Energy (BLE), Zigbee, Thread, ANT, ANT+, IEEE 402.15.4, IEEE 402.11.ah, or any other suitable wireless communication protocol. Alternatively, or additionally, I/O interface 208 may be configured to transmit and/or receive data using proprietary connectivity protocols. I/O interface 208 may comprise one or more antennas, such as a microstrip antenna. In some embodiments, I/O interface 208 may be connected to a cable, and may be configured to transmit and/or receive signals through the cable.

System 200 may be powered using power unit 204. Power unit 204 may be configured to power sense circuitry 206, I/O interface 208, MEMS accelerometer 202, or any suitable combination thereof. In some embodiments, power unit 204 may comprise one or more batteries. System 200 may, in at least some embodiments, consume sufficiently little power to allow for its operation for extended periods based solely on battery power. The battery or batteries may be rechargeable in some embodiments. Power unit 204 may comprise one or more lithium-ion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery. In some embodiments, power unit 204 may comprise circuitry to convert AC power to DC power. For example, power unit 204 may receive AC power from a power source external to system 200, such as via I/O interface 208, and may provide DC power to some or all the components of system 200. In such instances, power unit 204 may comprise a rectifier, a voltage regulator, a DC-DC converter, or any other suitable apparatus for power conversion.

Power unit 204 may comprise energy harvesting components and/or energy storage components, in some embodiments. Energy may be harvested from the surrounding environment and stored for powering the system 200 when needed, which may include periodic, random, or continuous powering. The type of energy harvesting components implemented may be selected based on the anticipated environment of the system 200, for example based on the expected magnitude and frequency of motion the system 200 is likely to experience, the amount of stress the system is likely to experience, the amount of light exposure the system is likely to experience, and/or the temperature(s) to which the system is likely to be exposed, among other possible considerations. Examples of suitable energy harvesting technologies include thermoelectric energy harvesting, magnetic vibrational harvesting, electrical overstress harvesting, photovoltaic harvesting, radio frequency harvesting, and kinetic energy harvesting. The energy storage components may comprise supercapacitors in some embodiments.

System 200 may be deployed in various settings to detect acceleration, including sports, healthcare, military, and industrial applications, among others. Some non-limiting examples are now described. A system 200 may be a wearable sensor deployed in monitoring sports-related physical activity and performance, patient health, military personnel activity, or other applications of interest of a user.

Figure 3:
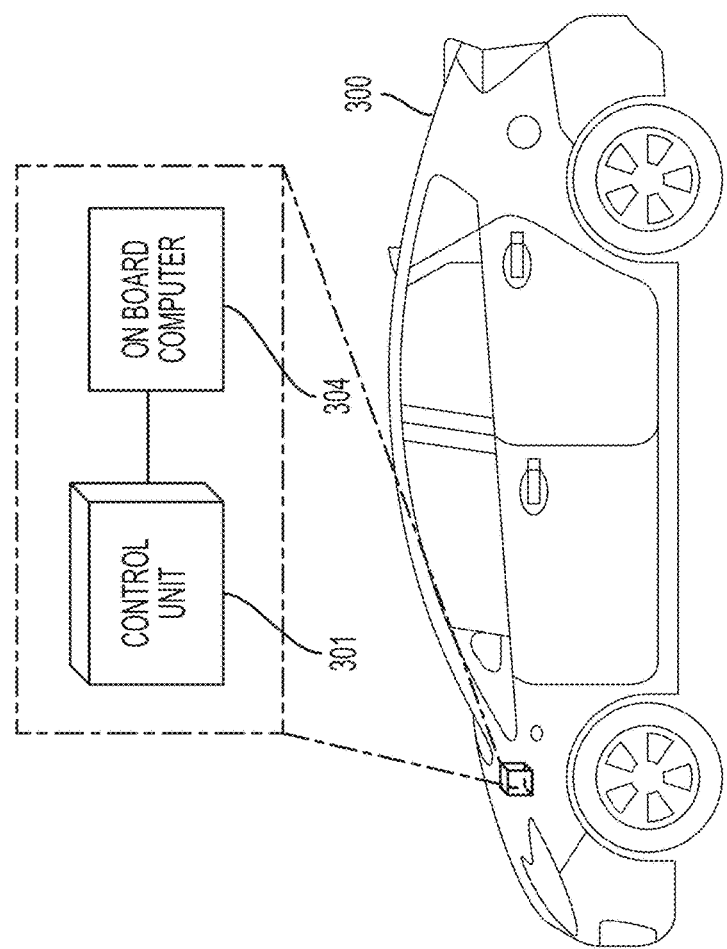
FIG. 3 illustrates an automobile in which may be employed the system of FIG. 2, in accordance with some embodiments of the technology described herein.

One such setting is in automobiles, or other vehicles, such as boats and aircraft. FIG. 3 illustrates an example, in which a sensor system of the types described herein is employed in a car. In the example of FIG. 3, an automobile 300 includes a control unit 301 coupled to an onboard computer 304 of the car by a wired or wireless connection. Control unit 301 may comprise system 200 of FIG. 2. System 200 may comprise a package or housing attached to a suitable part of the automobile 300, and may comprise a MEMS accelerometer of the type described herein. The MEMS accelerometer may, as an example, sense accelerations along the driving direction and/or perpendicular the driving direction. Additionally, or alternatively, the MEMS accelerometer may be configured to sense vertical accelerations, thus monitoring, for example, the status of the suspensions. Control unit 301 may receive power and control signals from the onboard computer 304, and may supply sense signals, such as compensated sense signals of the type described herein, to the onboard computer 304. In some situations, temperature variations within control unit 301 may induce stress to the MEMS accelerometer disposed therein. Operation of system 200 in the manners described with respect to FIG. 2 may mitigate, or eliminate, the impact of such stress.

Figure 4:
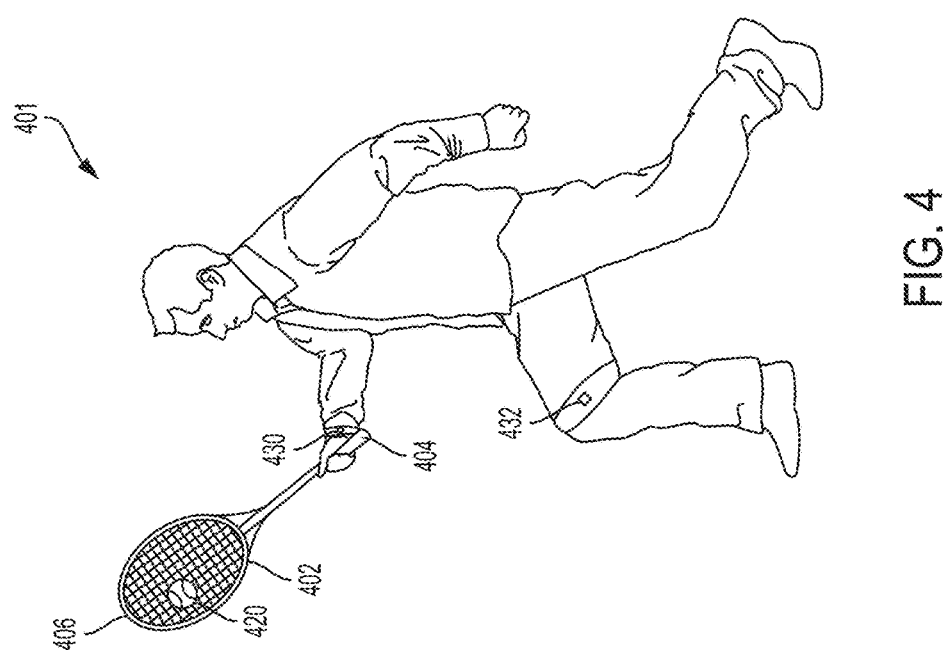
FIG. 4 illustrates a tennis player wearing a wearable device comprising the system of FIG. 2, in accordance with some embodiments of the technology described herein.

Another setting is in wearable devices for sports applications, such as tennis. FIG. 4 illustrates a tennis player 401 holding a racket 402, and wearing a wrist band 430 and a leg band 432. Racket 402 may comprise one or more devices attached thereon, such as devices 404 and 406. Such devices may each comprise a system 200, and may be configured to detect angular accelerations and/or linear accelerations. For example, device 404, mounted on the grip of racket 402, may be configured to sense accelerations associated with the racket's handle. Device 406, mounted on the racket's head, may be configured to sense accelerations associated with the any suitable part of the racket's head, such as the racket's tip. The devices 404 and 406 may be embedded within the racket frame or body in some embodiments. In some embodiments, data associated with accelerations experienced by racket 402 may provide an indication of the player's ability to play tennis. For example, information regarding a forehand motion, or a backhand motion, may be obtained. Player 401 may wear one or more wearable devices, such as a wrist band 430 and/or a leg band 432. Such wearable devices may each be equipped with a system 200, and may be configured to sense angular and/or linear accelerations. For example, a system 200, positioned on a wrist band, may be configured to provide information on the motion of the player's arm, while a system 200 positioned on a leg band, may be configured to provide information on the motion of the player's leg.

What is claimed is:

1. A micro electro-mechanical system (MEMS) accelerometer, comprising:
   at least one anchor coupled to a substrate;
   a proof mass connected to the at least one anchor; and
   a counter-balance mass connected to the proof mass and to the at least one anchor,
   wherein, in response to an acceleration of the MEMS accelerometer in a first direction, the proof mass is configured to move in the first direction and the counter-balance mass is configured to move in a second direction opposite from the first direction, and
   wherein, in response to displacement of the at least one anchor in the first direction, the proof mass and the counter-balance mass are configured to move in the first direction.

2. The MEMS accelerometer of claim 1, further comprising:
   a sense capacitor comprising a fixed electrode and a finger having a free end and a fixed end connected to the proof mass, the sense capacitor being configured to sense motion of the proof mass.

3. The MEMS accelerometer of claim 1, further comprising:
   a sense capacitor comprising a fixed electrode and a finger having a free end and a fixed end connected to the counter-balance mass, the sense capacitor being configured to sense motion of the counter-balance mass.

4. The MEMS accelerometer of claim 1, wherein the proof mass is heavier than the counter-balance mass.

5. The MEMS accelerometer of claim 1, wherein the proof mass is connected to the at least one anchor via one or more hinges.

6. The MEMS accelerometer of claim 1, wherein the proof mass is suspended above the substrate.

7. The MEMS accelerometer of claim 1, further comprising a beam, wherein the proof mass and the counter-balance mass are hingedly coupled to the beam.

8. The MEMS accelerometer of claim 1, wherein the first and second directions are in-plane with respect to the proof mass.

9. A micro electro-mechanical system (MEMS) accelerometer, comprising:
   at least one anchor coupled to a substrate;
   a beam movably coupled to the at least one anchor;
   a proof mass coupled to the beam and a counter-balance mass coupled to the beam; and
   a first electrode and a second electrode, the first and second electrodes being coupled to the substrate,
   wherein the proof mass forms a first capacitive sensor with the first electrode and the counter-balance mass forms a second capacitive sensor with the second electrode.

10. The MEMS accelerometer of claim 9, wherein the first and second electrodes are formed from a common mass.

11. The MEMS accelerometer of claim 9, wherein the first and second electrodes are formed from separate masses.

12. The MEMS accelerometer of claim 9, wherein the beam is coupled to the at least one anchor via a first hinge, the proof mass is coupled to the beam via a second hinge and the counter-balance mass is coupled to the beam via a third hinge,
   wherein the beam extends along a first direction, and
   wherein the first hinge is positioned between the second hinge and the third hinge in the first direction.

13. The MEMS accelerometer of claim 9, wherein, in response to an acceleration of the MEMS accelerometer in a first direction, the proof mass is configured to move in the first direction and the counter-balance mass is configured to move in a second direction opposite from the first direction.

14. The MEMS accelerometer of claim 13, wherein, in response to displacement of the at least one anchor in the first direction, the proof mass and the counter-balance mass are configured to move in the first direction.

15. The MEMS accelerometer of claim 9, wherein the proof mass is heavier than the counter-balance mass.

16. The MEMS accelerometer of claim 9, wherein the proof mass, the beam and the counter-balance mass are suspended above the substrate.

17. A method for detecting acceleration using a micro electro-mechanical system (MEMS) accelerometer, the method comprising:
    sensing motion of a proof mass in a first direction in response to acceleration of the MEMS accelerometer to obtain a first detection signal, the proof mass being coupled to at least one anchor;
    sensing motion of a counter-balance mass in a direction that is opposite from the first direction in response to the acceleration of the MEMS accelerometer to obtain a second detection signal, the counter-balance mass being coupled to the at least one anchor;
    sensing motion of the proof mass in a second direction in response to displacement of the at least one anchor to obtain a third detection signal;
    sensing motion of the counter-balance mass in the second direction in response to the displacement of the at least one anchor to obtain a fourth detection signal; and
    detecting the acceleration of the MEMS accelerometer using the first, second, third and fourth detection signals.

18. The method of claim 17, wherein the second direction is parallel to the first direction.

19. The method of claim 17, wherein:
    sensing motion of a proof mass in a first direction in response to acceleration of the MEMS accelerometer comprises sensing a variation in a capacitance of a first capacitive sensor;
    sensing motion of a counter-balance mass in a direction opposite the first direction in response to the acceleration of the MEMS accelerometer comprises sensing a variation in a capacitance of a second capacitive sensor;
    sensing motion of the proof mass in a second direction in response to displacement of the at least one anchor comprises sensing a variation in a capacitance of a third capacitive sensor; and
    sensing motion of the counter-balance mass in the second direction in response to the displacement of the at least one anchor comprises sensing the variation in the capacitance of the first capacitive sensor.

20. The method of claim 17, wherein the first and second directions are in-plane with respect to the proof mass.

* * * * *